US008542142B2

(12) United States Patent
Stein et al.

(10) Patent No.: US 8,542,142 B2
(45) Date of Patent: Sep. 24, 2013

(54) INTERLEAVED ANALOG TO DIGITAL CONVERTER WITH REDUCED NUMBER OF MULTIPLIERS FOR DIGITAL EQUALIZATION

(71) Applicant: Guzik Technical Enterprises, Mountain View, CA (US)

(72) Inventors: Anatoli B. Stein, Atherton, CA (US); Semen P. Volfbeyn, Palo Alto, CA (US); Valeriy Serebryanskiy, Sunnyvale, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 13/772,925

(22) Filed: Feb. 21, 2013

(65) Prior Publication Data

US 2013/0214958 A1    Aug. 22, 2013

Related U.S. Application Data

(60) Provisional application No. 61/601,360, filed on Feb. 21, 2012.

(51) Int. Cl.
*H03M 1/12*    (2006.01)

(52) U.S. Cl.
USPC ........... 341/156; 375/340; 375/233; 375/350; 375/316; 375/267; 708/319; 708/313; 708/300; 708/316; 370/290; 370/484; 341/140; 341/155; 341/159; 341/162

(58) Field of Classification Search
USPC ................. 341/122–155; 375/340, 130, 322, 375/233, 350, 316, 267, 345; 708/319, 313, 708/300, 316; 370/290, 484
See application file for complete search history.

(56) References Cited

U.S. PATENT DOCUMENTS

| 4,070,665 | A | * | 1/1978 | Glennon et al. | 341/115 |
|---|---|---|---|---|---|
| 5,030,954 | A | * | 7/1991 | Ribner | 341/172 |
| 5,148,166 | A | * | 9/1992 | Ribner | 341/143 |
| 5,239,299 | A | | 8/1993 | Apple et al. | |
| 5,488,636 | A | * | 1/1996 | Yamada et al. | 375/340 |
| 7,248,649 | B2 | * | 7/2007 | Demir et al. | 375/322 |
| 7,321,621 | B2 | * | 1/2008 | Popescu et al. | 375/233 |
| 7,324,618 | B2 | * | 1/2008 | Oh et al. | 375/350 |
| 7,408,495 | B2 | | 8/2008 | Stein et al. | |
| 7,532,684 | B2 | * | 5/2009 | Tietjen | 375/316 |
| 7,561,633 | B2 | * | 7/2009 | Parhi et al. | 375/267 |
| 7,729,679 | B1 | * | 6/2010 | Lee | 455/295 |
| 8,089,382 | B2 | * | 1/2012 | Pagnanelli | 341/143 |
| 2005/0151679 | A1 | | 7/2005 | Adams | |
| 2010/0182174 | A1 | | 7/2010 | Johansson et al. | |

\* cited by examiner

*Primary Examiner* — Lam T Mai
(74) *Attorney, Agent, or Firm* — Pierce Atwood LLP; Joseph M. Maraia

(57) ABSTRACT

A digital equalizer with a reduced number of multipliers for correction of the frequency responses of an interleaved ADC is disclosed. An exemplary interleaved analog to digital converter with digital equalization includes a composite ADC including M time interleaved sub-ADC, a demultiplexer, samples repositioning unit, a first PreFIRs transformer, a second PreFIRs transformer, K double buffer FIR filters, a PostFIRs transformer, a samples sequence restoration unit, and a multiplexer, coupled in series and providing an equalized, frequency response-corrected output.

9 Claims, 8 Drawing Sheets

An interleaved ADC and an equalizer with a reduced number of multipliers (N-group is a group of N samples).

An interleaved ADC and an equalizer with a reduced number of multipliers (N-group is a group of N samples).

Samples repositioning (quad is a group of four samples, x[n] is the initial sequence of samples, m is the number of a sub-ADC that produced the current quad).

Rule of PreFIRs transformer synthesis

PreFIRs transformer for N = 4

$x[n]$ is the input sequence of samples;
M is the number of sub-ADCs in the composite ADC;
m is the number of the sub-ADC that produced the current sample.

An assembly of double buffer FIR filters

Block diagram of a double buffer FIR filter

Rule of PostFIRs transformer synthesis

US 8,542,142 B2

INTERLEAVED ANALOG TO DIGITAL CONVERTER WITH REDUCED NUMBER OF MULTIPLIERS FOR DIGITAL EQUALIZATION

RELATED APPLICATIONS

This application claims the benefit of U.S. Provisional Patent Application No. 61/601,360, filed Feb. 21, 2012, the contents of which are incorporated by reference herein in it's entirety.

FIELD

The invention relates to high speed analog-to-digital converters (ADC) and, more particularly, to digital equalization of analog-to-digital conversion systems with an ADC that consists of a plurality of time interleaved sub-ADCs.

BACKGROUND

An increase in the sampling rate of analog-to-digital conversion may be achieved by the use of composite ADCs. A composite ADC contains a number of interleaved sub-ADCs with a common input and a sequential timing. If the number of sub-ADCs equals N, then the resulting conversion rate is N times larger than the rate of one sub-ADC.

Each sub-ADC incorporated in a composite ADC has its own amplitude frequency response and phase frequency response. The misalignment of amplitude and phase frequency responses of different sub-ADCs causes specific signal distortions, with the appearance of spurious frequency components being of prime importance.

The main way to prevent the appearance of the specific distortions in a composite ADC is to use equalization of its output digital signal. There are several patents concerned with digital equalization of a composite ADC output signal, for example U.S. Pat. No. 5,239,299, U.S. Pat. No. 7,408,495, US Patent Application Publication Nos. US 2005/0151679, US 2010/0182174, and others. The equalizer in these patents is an FIR filter (or a set of FIR filters), with the samples coming from each of sub-ADCs being corrected with equalizer coefficients that are calculated from the frequency responses of this sub-ADC.

The ADC equalizer is built usually as a conventional Finite Impulse Response (FIR) filter. The most resource consuming components of FIR filter are multipliers. As the equalizer length L may reach several hundreds of taps, the required number of multipliers becomes the main reason that makes it necessary to use in the equalizer design, more FPGAs and/or FPGAs of bigger size.

It is well known in the art that there is a need for reducing the number of multipliers in FIR filters by using more effective algorithms. There are different approaches to the solution of this problem. One that is most successful and most suitable for digital equalizer design was developed in the works of S. Winograd, Z. Mou and P. Duhamel.

The digital equalizer, like any FIR filter, forms its output sample by calculating a convolution between the input samples and equalizer coefficients. The Winograd-Mou-Duhamel algorithm reduces the number of multiplication in convolution calculation by using, at each clock cycle, some intermediate calculation results obtained in the preceding cycle.

A digital equalizer for an interleaved ADC is a time variant device. The equalizer coefficients that are used at a current clock cycle depend on responses of the correspondent sub-ADC and are different from coefficients used in the previous cycle. For this reason, the Winograd-Mou-Duhamel algorithm, as it is, cannot be directly used to reduce the multipliers number in an ADC digital equalizer.

The present technology provides a digital equalizer for an interleaved ADC that performs equalization of the frequency responses with a reduced number of multipliers.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

A digital equalizer for correction of the frequency responses of an interleaved ADC is described by an assembly of coefficients sets Hm[i]. Here, m is the number of a set and i, $0 \leq i < L$, is the number of a coefficient in the set, L being the length of the equalizer. The operation of a equalizer at any arbitrary time instant is controlled by the set Hm[i], where the number m of the set coincides with the number of the sub-ADC that produced the sample coming at this instant to the equalizer input. The coefficients set Hm[i] for a specific m, is determined from a measured frequency responses of the sub-ADC with the number m. If x[n] are samples at the input of an equalizer, then its output sample y[n] is formed as a convolution of L last input samples and the coefficients Hm[i]:

$$y[n] = \sum_{i=0}^{L-1} x[n-i] Hm[i]. \quad (1)$$

The sequence of samples x[n] produced by an interleaved ADC has an inherent regularity: the samples that are spaced by M clock cycles (M being the number of sub-ADCs in the interleaved ADC) come from the same sub-ADC. It means that at time instants spaced by M clock cycles the operation of the equalizer is controlled by the same set of coefficients. This fact creates the opportunity to reduce the number of multipliers in the equalizer: when calculating the equalizer output sample y[n] according to the equation (1), it is possible to use some intermediate results that were obtained M clock cycles before during the calculation of the sample y[n−M].

The digital equalizer for correction of the frequency responses of an interleaved ADC according to the present technology, is built with the use of parallel processing: the stream of digital samples created by an interleaved ADC and having samples rate F, is split into N samples sub streams with samples rate F/N each, the internal component units of equalizer handling the samples sub streams simultaneously. The samples rates ratio N is a parameter of the design and determines, in particular, the complexity of the resulting hardware. By increasing the parameter N, the factor of multipliers reduction may be increased.

As it will be clear from following disclosure, the internal structure of the equalizer makes it important that the parameter N equals two to the power of v, where v is an arbitrary integer.

Figure 1:
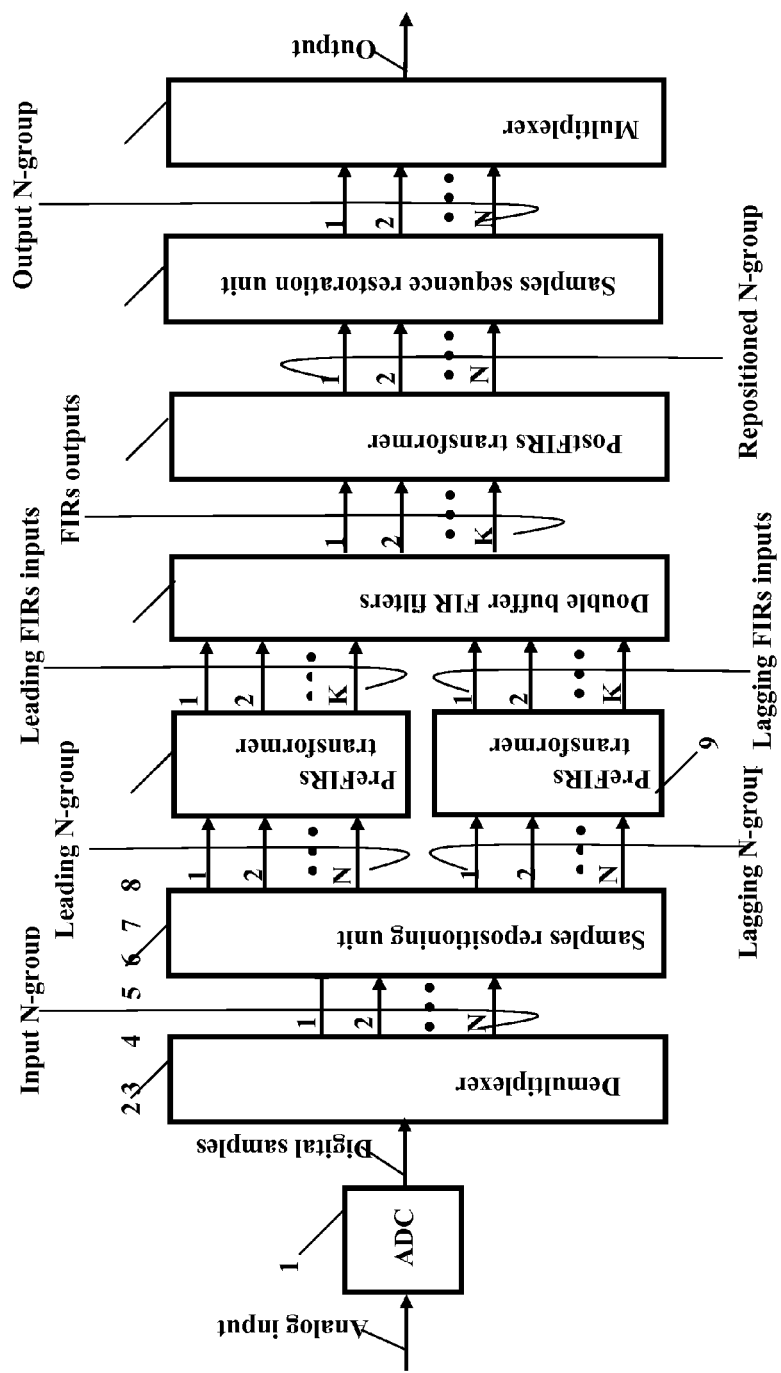
FIG. 1 is a block diagram of an interleaved ADC with a digital equalizer.

A block diagram of an interleaved ADC with a digital equalizer according to the present technology is shown in FIG. 1. This block diagram comprises an interleaved ADC 1, a demultiplexer 2, a samples repositioning unit 3, PreFIRs transformers 4 and 9, an assembly of double buffer FIR filters 5, PostFIRs transformer 6, samples sequence restoration unit 7 and a multiplexer 8.

The interleaved ADC 1 converts input analog signal into a stream of digital samples x[n]. This stream comes to the input of demultiplexer 2. The demultiplexer 2 splits the samples stream x[n] into N sub streams, the sample rate of each sub stream being reduced by factor N. N samples appear at the N outputs of the demultiplexer 2 at each period of the reduced samples rate; when the number of a period equals k, these N samples form a group (x[Nk], x[Nk+1], x[Nk+2], . . . , x[Nk+ N−1]).

An example of a sequence of input N-groups (N-group being a group of N samples) for N=4 is shown in FIG. 2A. The number of sub-ADCs in the interleaved ADC is equal to M=40.

N-groups from the outputs of the demultiplexer 2 are applied to the inputs of the samples repositioning unit 3. The samples repositioning unit 3 transposes samples, collecting in one N-group, samples that were produced by the same sub-ADC (see for example FIG. 2B and FIG. 2C, where, as before, N=4 and M=40).

There are discontinuities in the sequence of repositioned N-groups at the outputs of the samples repositioning unit 3. These discontinuities appear repeatedly with an interval of M N-groups. An example of discontinuity may be seen in the FIG. 2B where the quad (39, 79, 119, 159) is followed by a quad (160, 200, 240, 280), while the samples 40, 41, 42, . . . have already appeared in the previous quads. The samples repositioning unit 3 produces two streams of repositioned N-groups: the lagging N-groups and the leading N-groups. The samples in a leading N-groups are ahead of the samples in the corresponding lagging N-groups by an interval of (N−1)M (3M in the FIG. 2). The availability of two repositioned streams of N-groups makes it possible to obtain correct results after applying following operations of the effective filtering algorithm despite the mentioned discontinuities.

The sequence of input samples x[n] may by broken into segments with a length of NM samples, with the segment with the number r comprising samples with numbers r·NM≦n≦ (r+1)·NM−1. The samples repositioning unit 3, while processing the samples from the segment with the number r, forms M N-groups with numbers m, 0≦m≦M−1. All four samples of a quad with the number k belong to a sub stream of input samples that are produced by a sub-ADC with a number m. The lagging N-group with a number m, contains samples $(x[r \cdot NM+m], x[r \cdot NM+m+M], x[r \cdot NM+m+2M], \ldots, x[r \cdot NM+m+(N-1)M]),$ while the leading N-group with a number m, contains samples $(x[r \cdot NM+m-(N-1)M]], x[r \cdot NM+m-(N-2)M], x[r \cdot NM+m-(N-3)M], \ldots, x[r \cdot NM+m])$ that are ahead of the lagging quad samples by (N−1)M.

Figure 2:
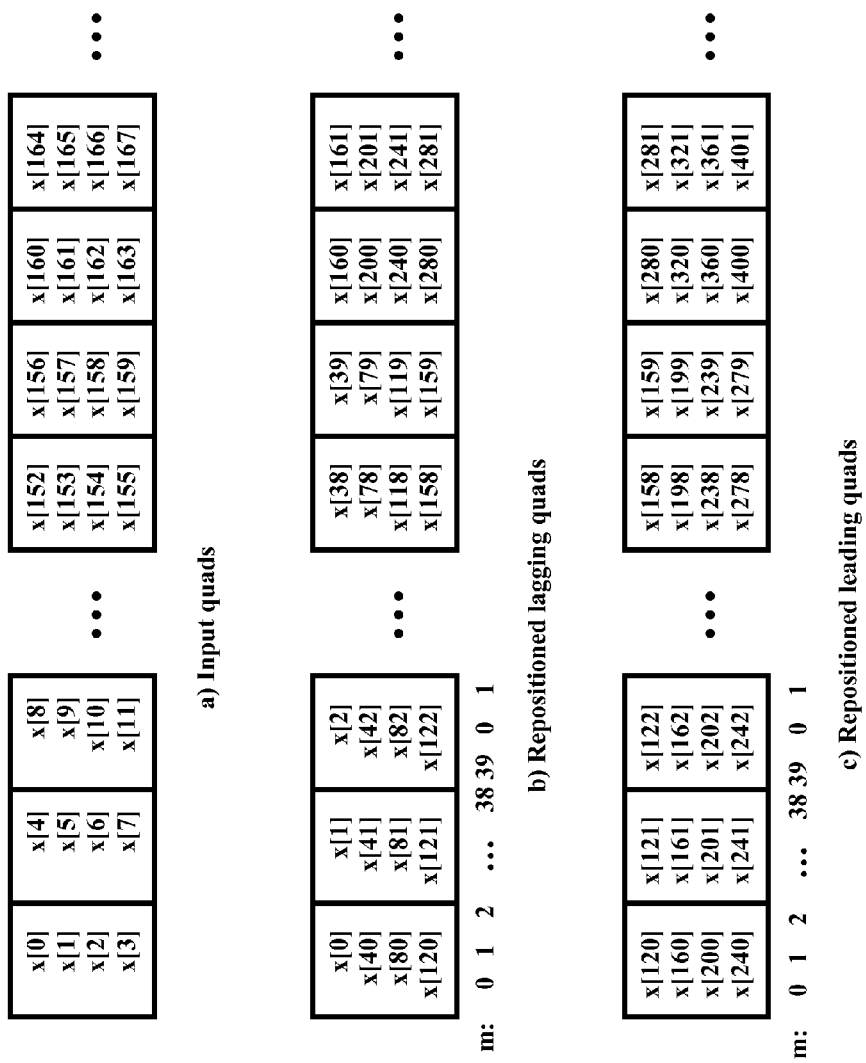
FIG. 2A-2C shows various examples of sample repositioning (quad is a group of four samples, x[n] is the initial sequence of samples, m is the number of sub-ADC that produce the current quad)

(In the example shown in FIG. 2, the lagging quad, with a number m, contains samples $(x[r \cdot 4M+m], x[r \cdot 4M+m+M], x[r \cdot 4M+m+2M], x[r \cdot 4M+m+3M]),$ while the leading quad, with a number m, contains samples $(x[r \cdot 4M+m-3M], x[r \cdot 4M+m-2M], x[r \cdot 4M+m-M], x[r \cdot 4M+m]),$ which are ahead of the lagging quad samples by 3M).

The leading N-group and the lagging N-group pass from the outputs of the samples repositioning unit 3 to the inputs of corresponding PreFIRs transformers 4 and 9. A PreFIRs transformer converts N-group into a set of K samples, with K being equal to three raised to the power of v.

A PreFIRs transformer for N=2 converts two input samples (a[1], a[2]) into three output samples (b[1], b[2], b[3]) in compliance with the next equations:

$b[1]=a[1];$ $b[2]=a[1]+a[2];$ $b[3]=a[2].$

A PreFIRs transformer for N>2 is constructed by an iterative procedure. The procedure is carried out step by step, with the iterative parameter n being equal to two at the first step, and being doubled at each transition to the next step. At each step, parameter k is supposed to correspond to the parameter n (with n being equal to two to the power of v, and k being equal to three to the power v, with v being the same arbitrary integer in both cases). A PreFIRs transformer of order 2n is constructed from two PreFIRs transformers of order n, and k PreFIRs transformers of order 2, in accordance with the next instructions (an order of PreFIRs transformer coincides with the number of its inputs):

denote the inputs 1, 2, . . . , n of the first PreFIRs transformer of order n as a[1], a[2], . . . , a[n];

denote the inputs 1, 2, . . . , n of the second PreFIRs transformer of order n as a[n+1], a[n+2], . . . , a[2n];

denote the outputs 1, 2, 3 of the PreFIRs transformer of order 2 having the number r as b[3r+1], b[3r+2], . . . , b[3r+3];

connect the output r of the first PreFIRs transformer of order n to the input 1 of the PreFIRs transformer of order 2 having the same number r;

connect the output r of the second PreFIRs transformer of order n to the input 2 of the PreFIRs transformer of order 2 having the same number r;

the procedure stops, when 2n reaches the value N.

Figure 3:
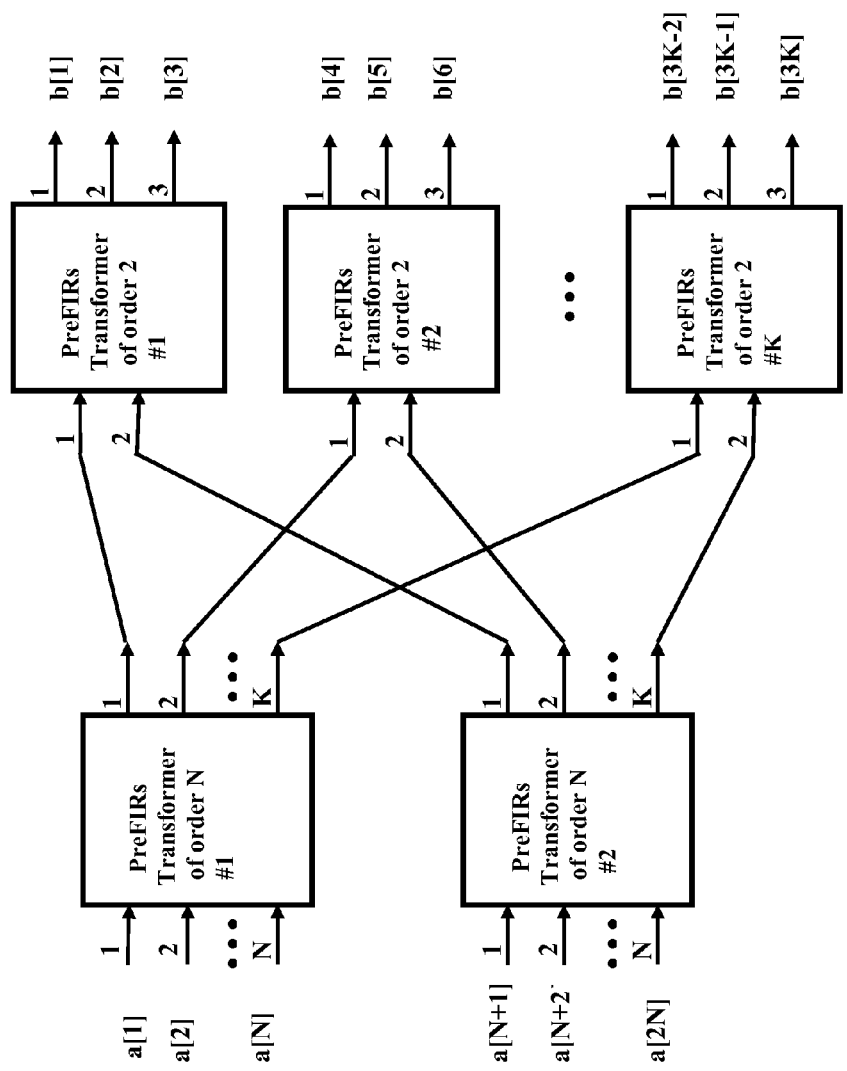
FIG. 3 shows the synthesis of a PreFIRs transformer of order 2n.

The synthesis of a PreFIRs transformer of order 2n is illustrated by the FIG. 3.

Using the instructions presented above, the next relationship is determined between the input and output samples of the PreFIRs transformer of order 4:

$b[1]=a[1];$ $b[2]=a[1]+a[3];$ $b[3]=a[3];$ $b[4]=a[3]+a[4];$ $b[5]=a[1]+a[2]+a[3]+a[4];$ $b[6]=a[1]+a[2];$ $b[7]=a[2];$ $b[8]=a[2]+a[4];$ $b[9]=a[4].$

Figure 4:
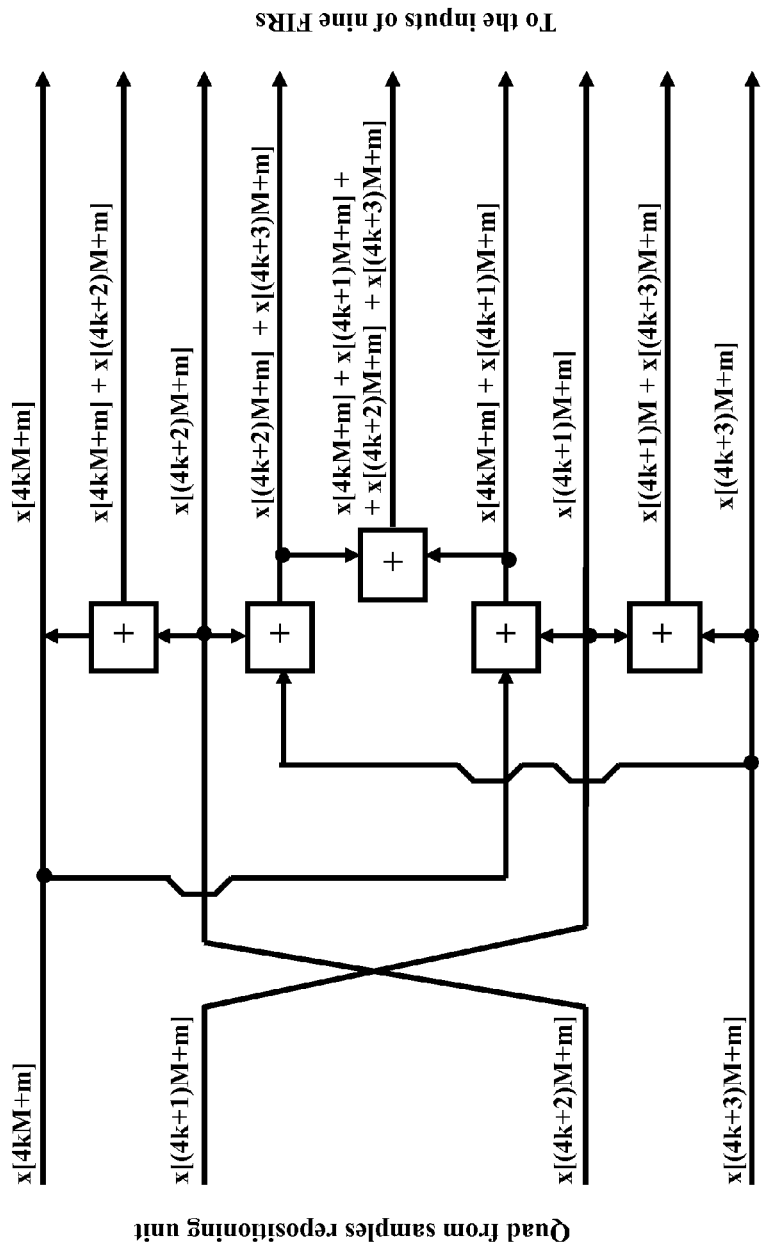
FIG. 4 is a block diagram of a PreFIRs transformer for the case of N=4.

A block diagram of a PreFIRs transformer for the case of N=4 is shown in the FIG. 4. It is easy to see that the combination of adders and delays connected according to this block diagram carries out the described transformation of a samples quad into set of nine samples.

Figure 5:
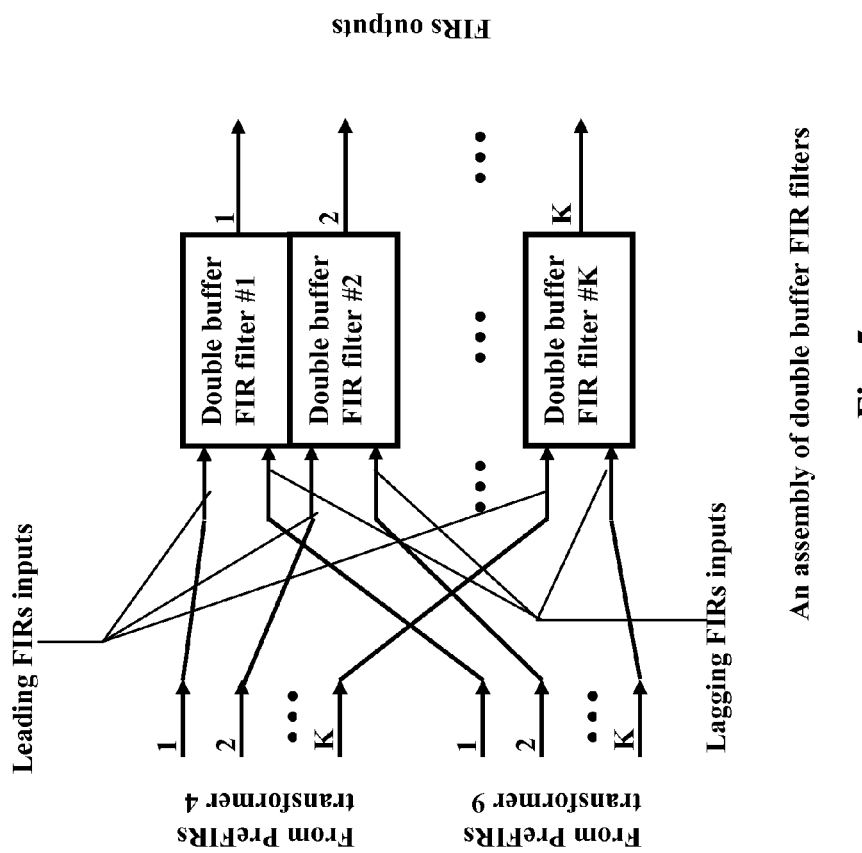
FIG. 5 shows connections inside the assembly of double buffer FIR filters.

The sets of K samples from the outputs of PreFIRs transformers 4 and 9 go to the correspondent inputs of the assembly of K double buffer FIR filters 5. The connections inside the assembly of double buffer FIR filters 5 are shown in the FIG. 5. The double buffer FIR filters have numbers from 1 to K. Each of double buffer FIR filters has a leading input, a lagging input and an output. The leading input of a double buffer FIR filter with the number r is connected to the output of the PreFIRs transformer 4 having the same number r. The lagging input of a double buffer FIR filter with the number r is connected to the output of the PreFIRs transformer 9 having the same number r.

Figure 6:
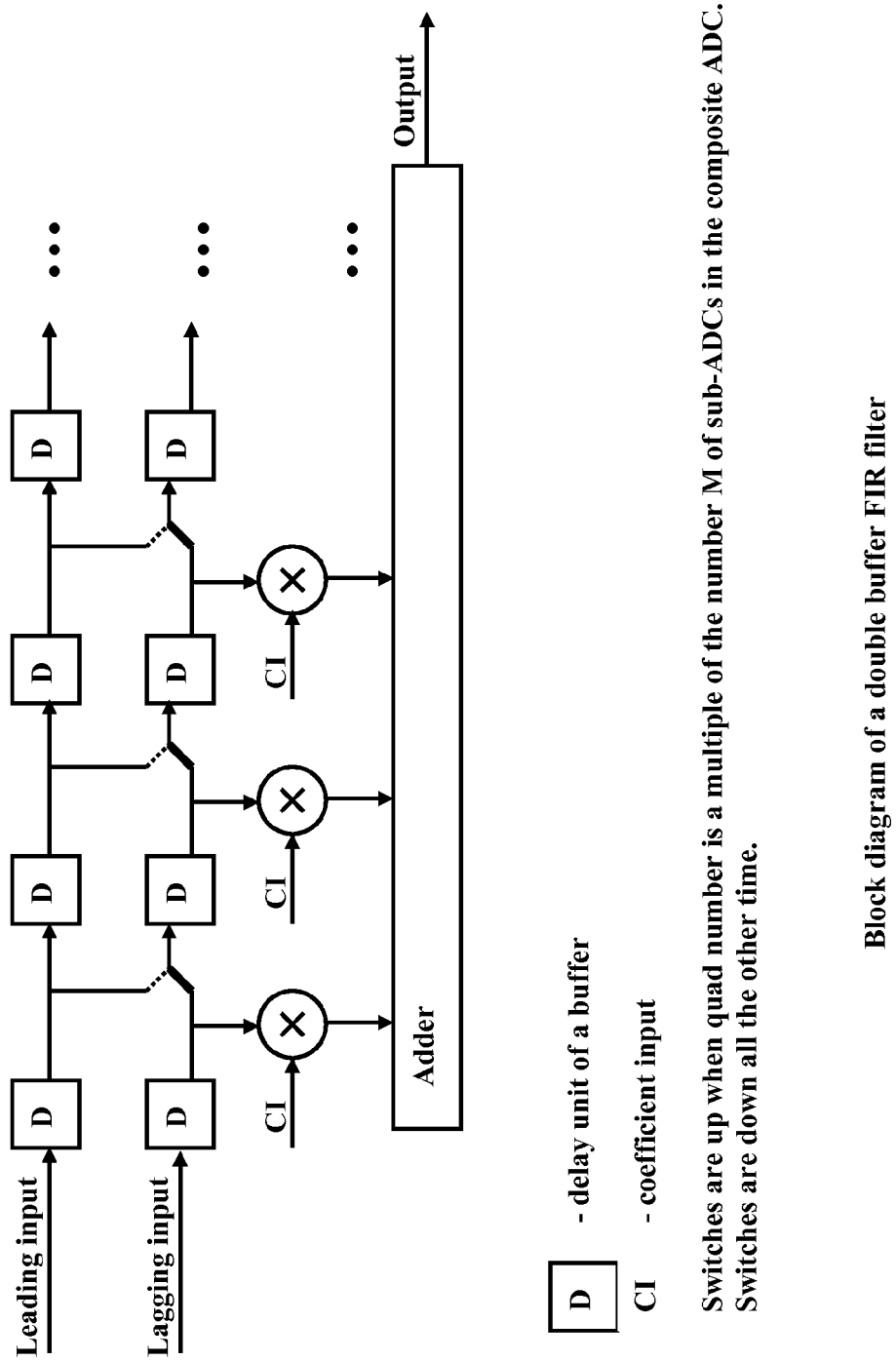
FIG. 6 shows a block diagram of a double buffer FIR filter.

A block diagram of a double buffer FIR filter is shown in the FIG. 6. This block diagram comprises a top buffer (a chain of delay units) and a bottom buffer. The samples coming to the leading input of the double buffer FIR filter are fed into the top buffer, and the samples coming to the lagging input of the double buffer FIR filter are fed into the bottom buffer. Most of the time both top and bottom buffers are advanced independently. However, each time when the number of the input N-group is a multiple of the number M of sub-ADCs in the composite ADC (i.e. when the continuity of samples sequence is broken), the switches in the double buffer FIR filter are moved over from the lower position into the upper position. At that clock cycle, the contents of the top buffer are loaded into the bottom buffer. Beginning with the next clock cycle, the switches in the double buffer FIR filter are returned from the upper position into the lower position, and the buffers are advanced independently again. Such operation of the double buffer FIR filter ensures that, at any instant, the sequence of samples in the bottom buffer repeats the corresponding interval of the input signal.

Each double buffer FIR filter with a number 1, $1 \leq 1 \leq K$ possesses coefficients h[1, m, i] that are applied to the corresponding multipliers of this double buffers FIR filter. Here m, $0 \leq m < M$, is the number of sub-ADC that produced current input sample, and i, $0 \leq i < L/4$, is the ordinal number of the coefficient in the set. These coefficients are calculated starting from the specified equalizer coefficients Hm[i] according to an iterative procedure defined by the collection of statements:

the procedure is carried out step by step, with the iterative parameter n being equal to two at the first step and being doubled at each transition to the next step up to the point when 2n=N;

at each step the length of each double buffers FIR filter equals L/n;

at the first step, the coefficients of the double buffers FIR filters are determined by equations $h[0,m,i]=Hm[i],$ $h[1,m,i]=Hm[i]+Hm[i+2M],$ and $h[2,m,i]=Hm[i+2M],$ where Hm[i] is the required assembly of the coefficients sets of the equalizer, M is the number of sub-ADC in the composite ADC, and $0 \leq i < L/2$;

at the step with an iterative parameter n, the coefficients h2[1, m, i] of the double buffers FIR filter with the length L/(2n) are found from the coefficients h1[1, m, i] of the double buffers FIR filter with the length L/n, in accordance with equations:

$h2[3r,m,i]=h1[r,m,i], 0 \leq r < k, 0 \leq i < L/(2n);$ $h2[3r+1,m,i]=h1[r,m,i]+h1[r,m,i+M], 0 \leq r < k, 0 \leq i < L/(2n);$ $h2[3r+2,m,i]=h1[r,m,i+M], 0 \leq r < k, 0 \leq i < L/(2n).$ As an example, the described procedure was applied to a double buffer FIR filter with the parameters N=4 and K=9. The resulting sets of coefficients follow the equations:

| | |
|---|---|
| $h[1,m,i]=Hm[i],$ | double buffer FIR filter #1 |
| $h[2,m,i]=Hm[i]+Hm[i+2M],$ | double buffer FIR filter #2 |
| $h[3,m,i]=Hm[i+2M],$ | double buffer FIR filter #3 |
| $h[4,m,i]=Hm[i+2M]+Hm[i+3M],$ | double buffer FIR filter #4 |
| $h[5,m,i]=Hm[i]+Hm[i+M]+Hm[i+2M]+Hm[i+3M],$ | double buffer FIR filter #5 |
| $h[6,m,i]=Hm[i]+Hm[i+M],$ | double buffer FIR filter #6 |
| $h[7,m,i]=Hm[i+M],$ | double buffer FIR filter #7 |
| $h[8,m,i]=Hm[i+M]+Hm[i+3M],$ | double buffer FIR filter #8 |
| $h[9,m,i]=Hm[i+3M].$ | double buffer FIR filter #9 |

The samples from the outputs of the assembly of double buffers FIR filters 5 are applied to the inputs of the PostFIRs transformer 6. A PostFIRs transformer 6 converts K input samples into a set of N samples.

A PostFIRs transformer for N=2 converts three input samples (a[1], a[2], a[3]) into two output samples (b[1], b[2]) in compliance with the equations:

$b[1]=a[1]+Da[3];$ $b[2]=a[2]-a[1]-a[3];$ where D means a delay for M clock cycles.

A PostFIRs transformer for N>2 is built by an iterative procedure with n as iteration parameter (n equals two to the power of v, and k equals three to the power of v). A PostFIRs transformer of order 2n is built from k PostFIRs transformers of order 2, and two PostFIRs transformers of order n in accordance with the instructions:

denote the inputs 1, 2, 3 of the PostFIRs transformer of order 2, having the number r, as a[3(r−1)+1], a[3(r−1)+2], . . . , a[3(r−1)+3];

denote the outputs 1, 2, . . . , n of the first PostFIRs transformer of order n as b[1], b[2], . . . , b[n];

denote the outputs 1, 2, . . . , n of the second PostFIRs transformer of order n as b[n+1], b[n+2], . . . , b[2n];

connect the output 1 of the PreFIRs transformer of order 2 with the number r to the input of the first PostFIRs transformer of order n with the same number r;

connect the output 2 of the PreFIRs transformer of order 2 with the number r to the input of the second PostFIRs transformer of order n with the same number r.

Figure 7:
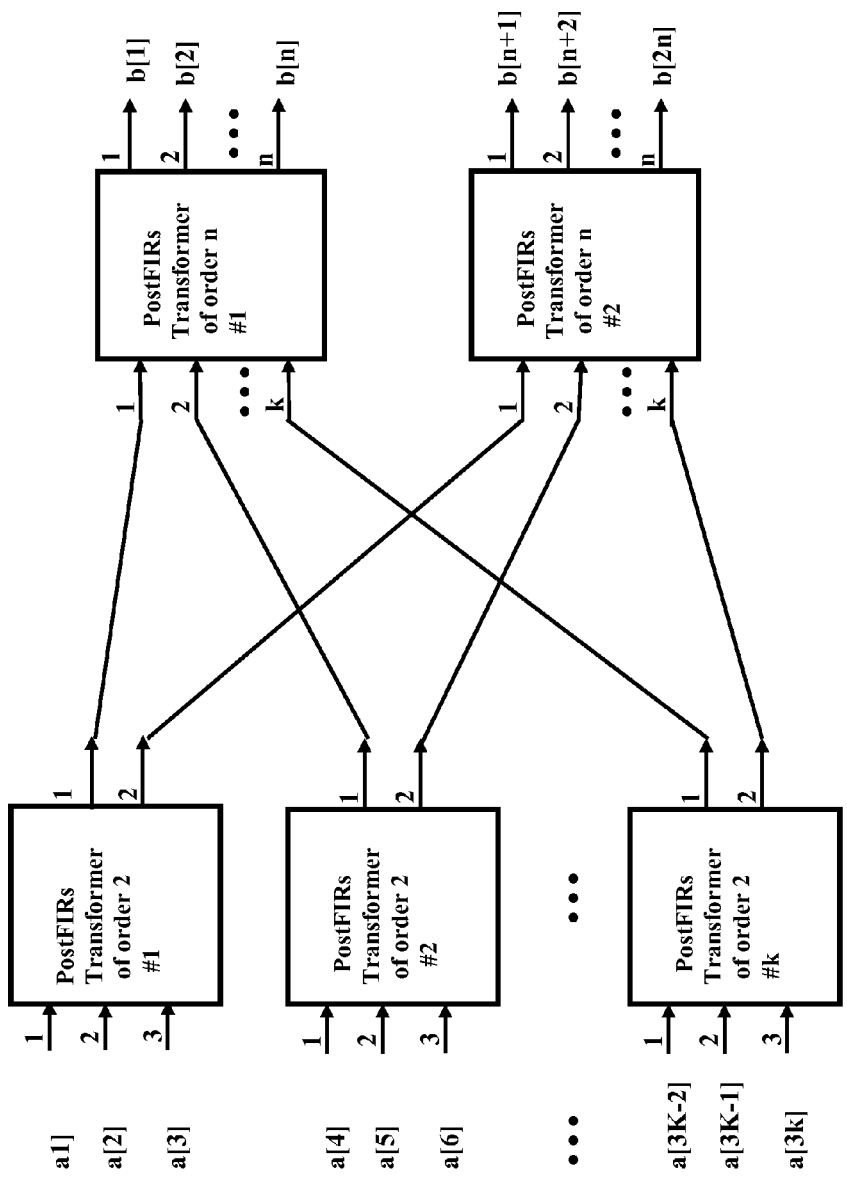
FIG. 7 shows the synthesis of a PostFIRs transformer of order 2n.

FIG. 7 illustrates the synthesis of a PostFIRs transformer of order 2n.

Figure 8:
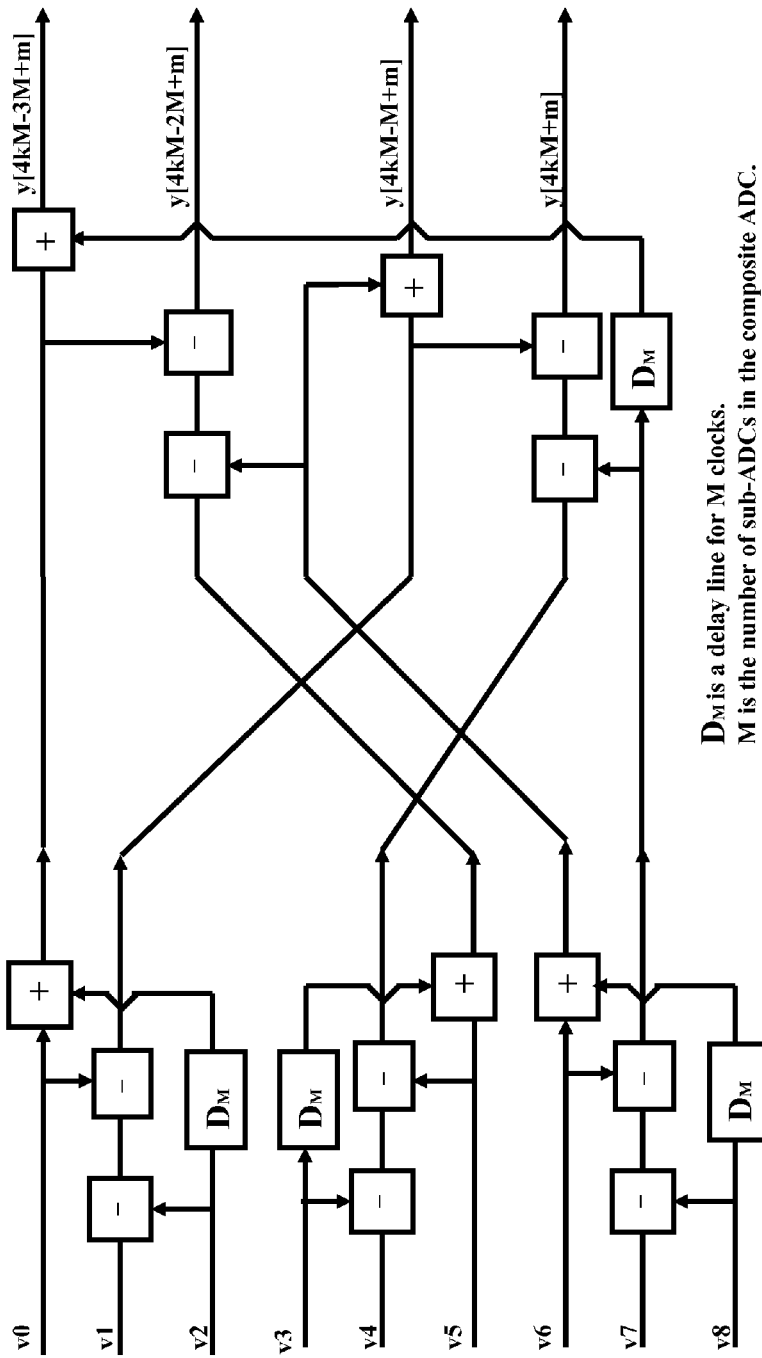
FIG. 8 shows a resulting block diagram for a PostFIRs transformer of order 4.

The instructions presented above were used to build a PostFIRs transformer of order 4. The resulting block diagram is shown in FIG. 8. It is easy to see that the combination of adders and delays connected according this block diagram transforms a set of nine input samples a[1], 1≦1≦9, into four output samples b[1], b[2], b[3], b[4], the relationship between the output and input samples being:

$$b[1]=a[1]+Da[3]+D(a[8]-a[7]-a[9]),$$

$$b[2]=a[6]+Da[4]-a[7]-Da[9],$$

$$b[3]=a[2]-a[1]-a[3]+a[7]+Da[9],$$

$$b[4]=a[5]-a[4]-a[6]-a[8]+a[7]+a[9]-a[2]+a[1]+a[3]).$$

The outputs of the PostFIRs transformer 6 are connected to the inputs of the samples sequence restoration unit 7. This unit transforms the input samples $$(y[r\cdot NM+m], y[r\cdot NM+m+M], y[r\cdot NM+m+2M], \ldots, y[r\cdot NM+m+(N-1)M]),$$

into a set of output samples (y[4k], y[4k+1], ..., y[4k+N−1]).

The outputs of the samples sequence restoration unit 7 are connected to the inputs of the multiplexer 8. The multiplexer 8 combines its input samples into an output sequence y[n], with the samples y[n] following the equation (1) presented above in the beginning of the detailed description.

If the interleaved ADC works with the samples rate F samples/s, and the equalizer length is L taps, then an equalizer with a structure of a common FIR filter has to carry out N1=F·L multiplication per second. In FIG. 1, demultiplexer 1 splits the samples stream coming from the ADC into N sub streams with samples rate F/N each. All units between the demultiplexer 1 and the multiplexer 8 work at this frequency. Each of the K double buffer FIR filters 5 contains L/N multipliers. In this example, the equalizer carries out N2=F/N·K·L/N=K/N²·F·L multiplication per second. Hence, the exemplary digital equalizer for an interleaved ADC, requires a number of multipliers that is reduced by factor of N1/N2=N²/K. For N=2, this factor equals 4/3=1.33; for N=4, this factor equals 16/9=1.78; for N=8, this factor equals 64/27=2.37, and so on.

When the samples stream produced by the interleaved ADC is split into two samples sub streams (N=2), the number of multipliers needed to construct a digital equalizer for an interleaved ADC according the present technology is reduced by a factor of N1/N2=4/3=1.33, which is noticeable smaller than the factor N1/N2=1.78 achievable for N=4 (splitting into four samples sub streams). On the other hand, when N>4 and the samples stream produced by the interleaved ADC is split into eight, sixteen or bigger number of samples sub streams, the factor of multipliers reduction increases, but the increased number of additional adders and delay lines makes the needed hardware prohibitively expensive. It seems that the case N=4 is most preferable from a practical use standpoint.

One skilled in the art will realize the invention may be embodied in other specific forms without departing from the spirit or essential characteristics thereof. The foregoing embodiments are therefore to be considered in all respects illustrative rather than limiting of the invention described herein. The scope of the invention is thus indicated by the appended claims, rather than by the foregoing description, and all changes that come within the meaning and range of equivalency of the claims are therefore intended to be embraced therein.

What is claimed is:

1. An interleaved analog to digital converter with digital equalization, comprising:
   A. a composite ADC including M time interleaved sub-ADCs and having a composite ADC input for receiving an input analog signal, and adapted for generating a corresponding stream of digital sample signals at a composite ADC output;
   B. a demultiplexer having an demux input coupled to the composite ADC output, and adapted to split the stream of digital sample signals into N sub streams with each sub stream characterized by a samples rate reduced by a factor N, and each sub stream being applied to a respective one of N demux outputs;
   C. a samples repositioning unit having N-group inputs coupled to respective ones of said N demux outputs, N-group leading outputs and N-group lagging outputs, and adapted for
      i. transposing digital sample signals by collecting for each N-group, samples that were produced by the same sub-ADC,
      ii. producing two streams of repositioned N-groups of the transposed digital sample signals, including lagging N-groups and leading N-groups, wherein digital sample signals in leading N-group are ahead of digital sample signals in corresponding lagging N-groups by an interval of (N−1)M,
      iii. applying the lagging N-groups to respective ones of the N-group lagging outputs, and
      iv. applying the leading N-groups to respective ones of the N-group leading outputs,
   D. a first PreFIRs transformer having N first PreFIRs inputs and K first PreFIRs outputs, and a second PreFIRs transformer having N second PreFIRs inputs and K second PreFIRs outputs,
      wherein the inputs of the first PreFIRs transformer are connected to respective ones of the N N-group leading outputs, and the first PreFIRs transformer is adapted to iteratively process the leading N-group digital sample signals to generate leading FIR input digital sample signals and apply the so-processed signals to respective ones of the K first PreFIRs outputs, and
      wherein the inputs of the second PreFIRs transformer are connected to respective ones of the N-group lagging outputs, and the second PreFIRs transformer is adapted to iteratively process the lagging N-group digital sample signals to generate lagging FIR input digital sample signals and apply the so-processed signals to respective ones of the K second PreFIRs outputs,
   E. K double buffer FIR filters, each double buffer FIR filter having K leading FIR inputs, K lagging FIR inputs and K FIR filter outputs, wherein the K leading FIR inputs of the double buffer FIR filter are connected to corresponding outputs of the first PreFIRs transformer and the K lagging FIR inputs of the double buffer FIR filter are connected to corresponding outputs of the second PreFIRs transformer, and wherein the K double buffer FIR filters effect K coefficient-weighted combinations of the processed leading N-group digital sample signals applied from the first PreFIRs transformer and the processed lagging N-group digital sample signals applied from the second PreFIRs transformer, and apply those K coefficient-weighted combinations to respective ones of the K FIR filter outputs;
   F. a PostFIRs transformer with K PostFIRs inputs and N PostFIRs outputs, wherein each of the K PostFIRs inputs is connected to the output of a corresponding double buffer FIR filter, and wherein each PostFIRs transformer is adapted iteratively process the applied K coefficient-weighted combinations and apply the so-processed coefficient-weighted combinations to respective ones of the N PostFIRs outputs, G. a samples sequence restoration unit having N repositioned N-group inputs connected to respective ones of the N PostFIRs outputs, and N-group outputs, wherein the samples sequence restoration unit is adapted for generating a restored sample stream comprising restored N sub stream samples, wherein the order of samples is restored to an initial order, and applying the restored sample stream to the respective N-group outputs; and H. a multiplexer having N mux inputs connected to the N-group outputs of the samples sequence restoration unit, and an equalizer output, and wherein the multiplexer is adapted for combining the restored N sub stream samples from the samples sequence restoration unit into one output samples stream applied to the equalizer output.

2. An interleaved analog to digital converter with digital equalization as in claim 1, wherein the parameter N is equal to two raised to the power of v, and K is equal to three raised to the power of v, wherein the quantity v is an integer.

3. An interleaved analog to digital converter with digital equalization as in claim 2, wherein each PreFIRs transformer is constructed by an iterative procedure defined by statements:

a) the procedure is carried out step by step, where the iterative parameter n is equal to 2 at the first step and is doubled at the transition to a next step;

b) at each step, the procedure starts from PreFIRs transformer of order n and produces an PreFIRs transformer of order 2n, wherein the order of PreFIRs transformer is equal to its number of inputs;

c) PreFIRs transformer of order 2n comprises two PreFIRs transformers of order n, and k PreFIRs transformers of order 2, wherein the parameter k corresponds to the parameter n;

d) the inputs of the first and second PreFIRs transformers of order n are used as the inputs of the PreFIRs transformer of order 2n, wherein the outputs of three K PreFIRs transformers of order 2 are used as the outputs of the PreFIRs transformer of order 2n;

e) a first input of each PreFIRs transformer of order 2 with a number r, is connected to r-th output of a first PreFIRs transformer of order n, and a second input of each PreFIRs transformer of order 2 with a number r, is connected to r-th output of a second PreFIRs transformer of order n;

f) each of said PreFIRs transformers of order 2 converts two input samples a[1], a[2] into three output samples b[1]=a[1], b[2]=a[1]+a[2] and b[3]=a[2]; and g) the procedure stops, when 2n reaches the parameter N.

4. An interleaved analog to digital converter with digital equalization as in claim 2, wherein each double buffers FIR filter comprises:

a leading buffer with an input and L/4−1 outputs, where L is a required equalizer length, and wherein an input of the leading buffer is a leading input of the double buffers FIR filter;

a lagging buffer with a main input, L/4−1 inputs and L/4 outputs, wherein the main input is the lagging input of the double buffers FIR filter and the L/4−1 auxiliary inputs are connected to the outputs of the leading buffer; and a multiply-add unit with L/4 inputs and an output, wherein the inputs of the multiply-add unit are connected to the outputs of the lagging buffer, and the output of the multiply-add unit is an output of the double buffers FIR filter.

5. An interleaved analog to digital converter with digital equalization as in claim 4, wherein a leading buffer of the double buffers FIR filter is a tapped delay line of L/4−1 delay units, wherein an output of each delay unit is an output of the leading buffer.

6. An interleaved analog to digital converter with digital equalization as in claim 5, wherein a lagging buffer of the double buffers FIR filter is a tapped delay line of L/4 delay units, and an input of the first delay unit is a main input of the lagging buffer, wherein L/4−1 two inputs switches are between each two adjacent delay units, wherein a first input of the two inputs switch is connected to an output of an immediately preceding delay unit, a second input of the two inputs switch is an auxiliary input of the lagging buffer, and an output of the two inputs switch is connected to an input of a following delay unit.

7. An interleaved analog to digital converter with digital equalization as in claim 6, wherein a state of the two inputs switches in the lagging buffer of the double buffers FIR filter depending of the number m of a sub-ADC that produced samples applied to the input of the lagging buffer of the double buffers FIR filter, whereby the output of the two inputs switch is connected to the first input of the switch when m≠0 and to the second input of the switch when m=0.

8. An interleaved analog to digital converter with digital equalization as in claim 7, wherein each double buffers FIR filter is adapted to possess a set of coefficients h[1, m, i] applied to the multipliers of the double buffers FIR filter, and depending on the number of the double buffers FIR filter, the number m of the sub-ADC that produced samples applied to the inputs of the double buffers FIR filter, and the number i of the multiplier of the double buffers FIR filter, said coefficients are determined by an iterative procedure defined by the statements:

a) the procedure is carried out step by step, wherein the iterative parameter n is equal to two at a first step and is doubled at each transition to a next step up to the point when 2n=N;

b) at each step, the length of each double buffers FIR filter equals L/n;

c) at the first step, the coefficients of the double buffers FIR filters are determined by equations $$h[0,m,i]=Hm[i],$$

$$h[1,m,i]=Hm[i]+Hm[i+2M],$$

$$h[2,m,i]=Hm[i+2M],$$

where Hm[i] is an assembly of the coefficients sets of the equalizer, M is the number of sub-ADC in the composite ADC, and $0 \leq i < L/2$; and d) at the step with an iterative parameter n, the coefficients h2[1, m, i] of the double buffers FIR filter with the length L/(2n) are found from the coefficients h1[1, m, i] of the double buffers FIR filter with the length L/n, in accordance with:

$$h2[3r,m,i]=h1[r,m,i],\ 0\leq r<k,\ 0\leq i<L/(2n);$$

$$h2[3r+1,m,i]=h1[r,m,i]+h1[r,m,i+M],\ 0\leq r<k,\ 0\leq i<L/(2n);$$

$$h2[3r+2,m,i]=h1[r,m,i+M],\ 0\leq r<k,\ 0\leq i<L/(2n).$$

9. An interleaved analog to digital converter with digital equalization as in claim 2, wherein the PostFIRs transformer are constructed as an iterative procedure defined by statements:
- a) the procedure is carried out step by step, wherein the iterative parameter n is equal to 2 at the first step, and is doubled at a transition to the next step up to the point when 2n=N;
- b) at each step, the procedure starts from PostFIRs transformer of order n, and produces a PostFIRs transformer of order 2n, wherein an order of PostFIRs transformer is equal to its number of outputs);
- c) PostFIRs transformer of order 2n comprises k PostFIRs transformers of order 2, and two PostFIRs transformers of order n, wherein the parameter k corresponds to the parameter n;
- d) inputs of k PostFIRs transformers of order 2 are inputs of the PostFIRs transformer of order 2n, wherein outputs of two PostFIRs transformers of order 2 are outputs of a PostFIRs transformer of order 2n;
- e) a first output of each PostFIRs transformer of order 2 with a number r, is connected to an r-th input of a first PostFIRs transformer of order n, and a second output of each PostFIRs transformer of order 2 with a number r, is connected to an r-th input of a second PostFIRs transformer of order n; and
- f) each of the PostFIRs transformers of order 2 converts three input samples $a[1]$, $a[2]$, $a[3]$ into two output samples $b[1]=a[1]+Da[3]$ and $b[2]=a[2]-a[1]-a[3]$, where D denotes delay by M clock cycles.

* * * * *